United States Patent
Face, Jr. et al.

[11] Patent Number: 6,144,142
[45] Date of Patent: Nov. 7, 2000

[54] MULTI-LAYER PIEZOELECTRIC TRANSFORMER MOUNTING DEVICE

[75] Inventors: Samuel Allen Face, Jr., Norfolk; Richard Patten Bishop, Fairfax Station; Clark Davis Boyd, Hampton, all of Va.

[73] Assignee: Face International Corp., Norfolk, Va.

[21] Appl. No.: 09/188,052

[22] Filed: Nov. 6, 1998

[51] Int. Cl.$^7$ ................................. H01L 41/08
[52] U.S. Cl. .................... 310/358; 310/354; 310/359; 310/366
[58] Field of Search .................. 310/348, 354, 310/355, 356, 332, 358, 359, 366

[56] References Cited

U.S. PATENT DOCUMENTS

| | | | |
|---|---|---|---|
| 1,949,149 | 2/1934 | Ellis | 310/354 |
| 2,329,498 | 9/1943 | Washburn | 310/354 |
| 3,253,674 | 5/1966 | Desmares | 310/366 X |
| 4,511,820 | 4/1985 | MacKenzie | 310/355 X |
| 5,118,982 | 6/1992 | Inoue et al. | 310/366 |
| 5,329,200 | 7/1994 | Zaitsu | 310/359 X |
| 5,834,882 | 11/1998 | Bishop | 310/359 |

*Primary Examiner*—Mark O. Budd
*Attorney, Agent, or Firm*—Stephen E. Clark; David J. Bolouc

[57] ABSTRACT

A laminated multi-layer piezoelectric transformer comprising two elements joined together with a conductive adhesive and having a bead of the conductive adhesive at the point of junction of the two elements on the exterior surface of the laminated multi-layer piezoelectric transformer and a mounting device for use therewith and comprising a conductive base having a first contact, and curvaceous arms extending at generally at right angles from the conductive base about said laminated multi-layer piezoelectric transformer, a portion of said arms contacting said bead and preferably designed to engage the distal ends of the arms of an insulating cap mounted on the opposing side of the laminated multi-layer piezoelectric transformer said cap having a second contact therein. This combination configured for mounting on a circuit board is also described.

17 Claims, 4 Drawing Sheets

MULTI-LAYER PIEZOELECTRIC TRANSFORMER MOUNTING DEVICE

BACKGROUND OF THE INVENTION

1. Field of the Invention

The present invention relates to devices for easily and securely mounting multi-layer piezoelectric transformers. More specifically it relates to a mounting device that permits durable incorporation of such transformers into, for example, printed circuitry with a minimum of processing steps.

2. Description of Prior Art

Wound electromagnetic transformers are well known in the art. The problems with miniaturizing them are similarly well known. To address these problems, piezoelectric transformers utilizing the piezoelectric effect of certain ceramic materials, that can be made much smaller, especially to handle relatively low voltages, have been designed and manufactured. Additionally, piezoelectric transformers are non-flammable and produce no electromagnetically induced noise.

A variety of physical configurations of piezoelectric transformers have been designed and manufactured, including rings, circles, flat slabs and the like. One of the best known of such transformers is the so-called "Rosen" type. The basic Rosen-type piezoelectric transformer was disclosed in U.S. Pat. No. 2,830,274 to Rosen, and numerous versions and variations of this basic apparatus are well known in the art. The typical Rosen-type transformer comprises a flat slab of ceramic that is appreciably longer than it is wide and substantially wider than it is thick. Activation of the transformer is achieved by differentially poling the ceramic slab and attaching electrical leads to the major and minor faces of the ceramic slab to obtain electrical input thereto and output therefrom. The attachment of electrical leads to the faces of such devices by soldering or otherwise has always been a problem in the manufacturing process. Since the Rosen type transformer undergoes deformation in use, the durable attachment of leads is particularly vexing.

In order to overcome many of the problems inherent with the Rosen type piezoelectric transformer, including the need for dual poling, laminated piezoelectric transformers comprising two ceramic slabs separated by a series of metallic sheets bonded to the ceramic slab have been proposed.

A device of this type is depicted in FIG. 1 wherein a first piezoelectric wafer 30 is has two substantially parallel faces 32 and 38 that are electroplated. A second piezoelectric wafer 48 has two substantially parallel, electroplated faces 46 and 50. A first, typically, but not necessarily, pre-stressed, layer 36 is positioned adjacent electroplated surface 32. An adhesive layer 34 is disposed between the first layer 36 and adjacent electroplated surface 32 of wafer 30 for purposes of bonding the two members together. The first layer 36 is typically a metal having a coefficient of thermal expansion/contraction greater than that of the material of ceramic wafer 30.

A second typically, but not necessarily, pre-stressed layer 42 is positioned adjacent the other electroplated surface 38 of wafer 30. An adhesive layer 40 is disposed between the second layer 42 and the adjacent electroplated surface 38 of ceramic wafer 30 for purposes of bonding the two members together. The second layer 42 is typically a metal having a coefficient of thermal expansion/contraction that is greater than that of ceramic wafer 30.

Electroplated later 46 of second ceramic wafer 48 is positioned adjacent second player 42 such that layer 42 is between ceramic wafers 30 and 48. An adhesive layer 44 is disposed between layer 42 and electroplated surface 46 for purposes of bonding the two members together. Layer 36 typically has a coefficient of thermal expansion/contraction greater than that of ceramic wafer 48.

A third, typically, but not necessarily, pre-stressed layer 54 is positioned adjacent the other electroplated surface 50 of ceramic wafer 48. Adhesive layer 52 is disposed between third layer 54 and the adjacent electroplated surface 50 of ceramic wafer 48 for purposes of boding the two members together. The third layer 54 is typically a metal having a coefficient of thermal expansion/contraction that is greater than that of ceramic wafer 48.

After fabrication of the laminated multi-layer piezoelectric transformer device 1, ceramic wafers 30 and 48 are poled in one direction, such that when a voltage is applied across electrodes 46 and 50 or 32 and 38, the wafer will strain longitudinally. Conversely, the application of longitudinal strain to poled ceramic wafers 30 and 48 results in the generation of voltage between corresponding electrodes 46 and 50 or 32 and 38.

When a primary, or "input", voltage is applied across electrodes 32 and 38, poled ceramic wafer 30 piezoelectrically generates an extensional stress commensurate with the magnitude of the input voltage V1. The extensional stress generated by input voltage V1 causes ceramic wafer 30 to be strained as indicated by arrow 64, which, in turn, causes ceramic wafer 48 to strain, as indicated by arrow 65, which, in turn, piezoelectrically generates a voltage V2 across electroplated surfaces 46 and 50.

At resonant frequency, the occurrence of this strain, as is clear to the skilled artisan, causes a significant deformation in the composite structure, as the voltage cycles from positive to negative. This deformation, even at a normal 60 cycles, results in significant strain and vibrational energy which, in turn, translates into a strain on and subsequent fatigue degradation of the joints 51, 53, and 55 where the electrical leads 56, 58 and 60 are attached by soldering or otherwise. In fact, it has proven very difficult to design and implement a reliable and durable lead attachment system for such multi-layer resonating piezoelectric transformers that can withstand such strain over a long period of time.

Furthermore, because of the design of this type of very efficient transformer, as with the Rosen type transformer, it is difficult to incorporate the transformer into a printed circuit board with any degree of reliability.

SUMMARY OF THE INVENTION

It is therefore an object of the present invention to provide a durable and reliable contact device for such laminated multi-layer piezoelectric transformers.

It is a further object of the present invention to provide such a contact device that is easy to use and is readily adaptable to permit easy installation of such multi-layer piezoelectric transformers into conventional circuit boards.

Further objects and advantages will become apparent from a consideration of the ensuing description and drawings.

DESCRIPTION OF THE DRAWINGS

The invention will be more fully understood from the following detailed description taken in conjunction with the accompanying drawings, which form part of this application and wherein.

DETAILED DESCRIPTION

As described hereinabove, the laminated multi-layer piezoelectric transformers of the prior art undergo significant strain and vibration in use as they flex under the influence of applied voltage. Such flexure and the concomitant induced fatigue of electrical lead attachments has been a vexing problem that has adversely affected the ability to utilize such devices in applications where they will undergo large numbers of flexural cycles in the course of their useful "lives".

Additionally, such devices can be configured in any number of geometric shapes depending upon the particular use to which they are put, and the type and amount of energy they are expected to handle. For example, rectangular, round and ring-shaped shapes have been proposed for differing applications. Whatever geometric shape is used, there may be a problem of flex-induced fatigue as it relates to the ability to easily and reliably attach electrical leads to the device. Such problems are enhanced in such devices that are geometrically symmetrical and operating at natural (resonant) frequencies, as the magnitude of deformation may be many times greater than in asymmetric non-resonating devices.

In most applications of multi-layer, parallel-poled piezoelectric transformers, the devices will be designed such that, for the particular application, a specific device of the proper geometric configuration, which operates at its resonant frequency (its optimum or most efficient frequency) will be used.

As previously indicated, laminated multi-layer piezoelectric transformers may be configured in any of a number of geometric shapes. For purposes of the present discussion, a round geometry has been selected, but it will be apparent to the skilled artisan that a square or other oblong could also be used with the transformer mounting device of the present invention.

Figure 1:
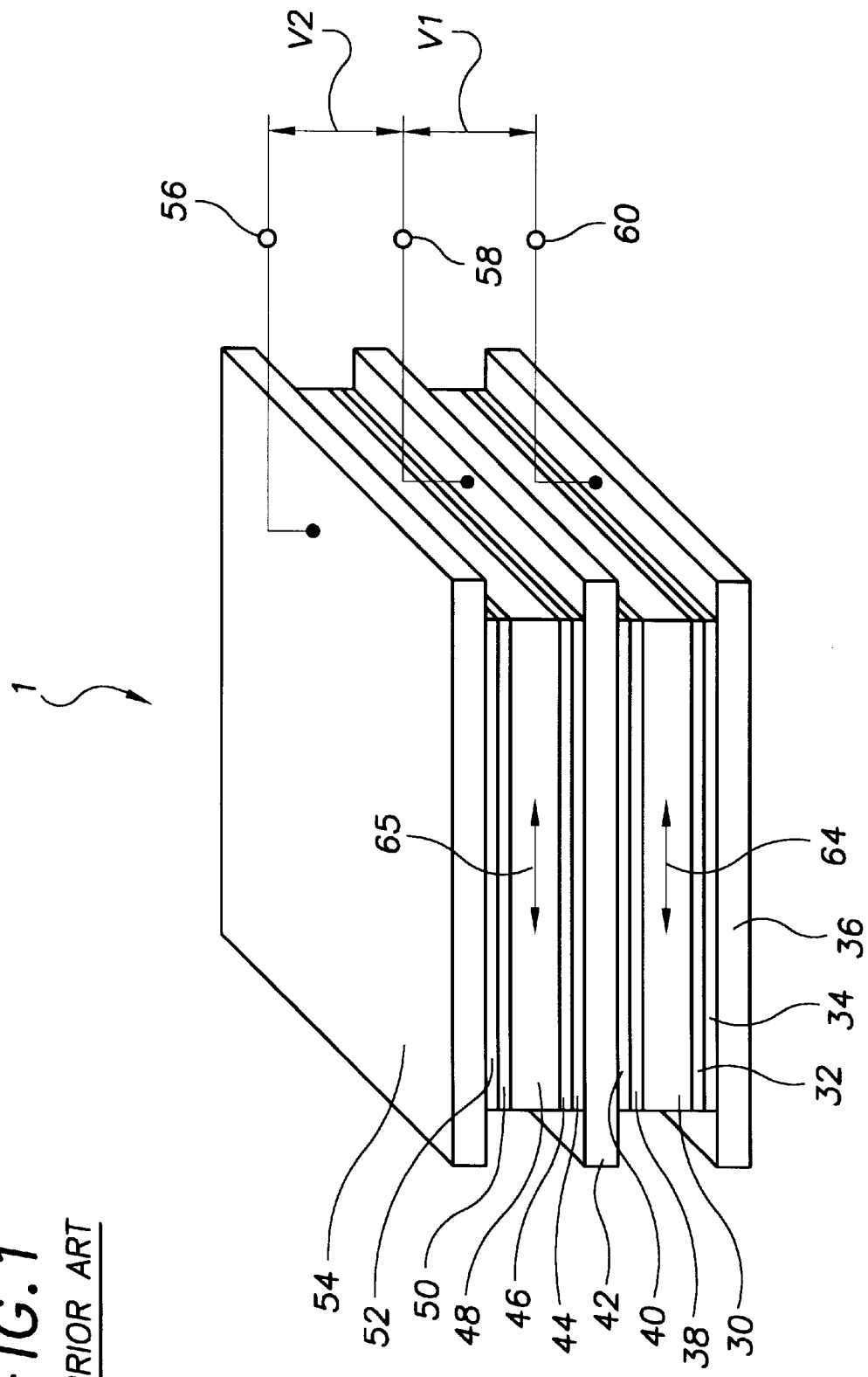
FIG. 1 is a perspective view of a piezoelectric transformer device of the prior art of the type with which the contact device of the present invention is particularly useful.
Figure 2:
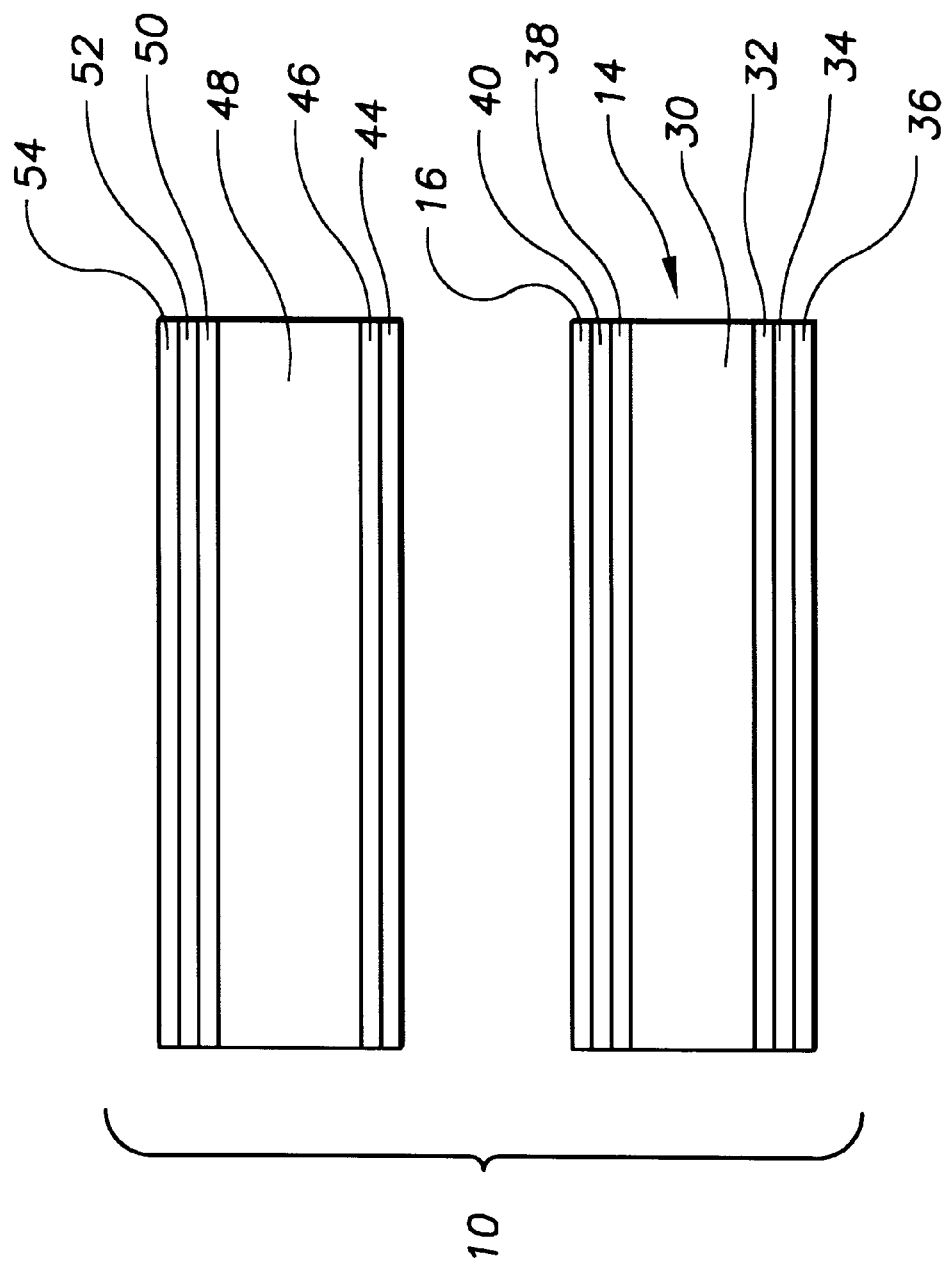
FIG. 2 is a cross-sectional, blown apart view of a round piezoelectric transformer device of the present invention.

As shown in cross-section in FIG. 2, in accordance with the present invention, the piezoelectric transformer device of the prior art 10 has been divided into two portions, an upper portion 12 and a lower portion 14. Each of these portions 12 and 14 has the same basic configuration as the similar portions of the prior art device depicted at 1 in FIG. 1, namely upper portion 12 comprises a ceramic wafer 48 having adhesive and conductive metallic layers 44, 46, 50, 52, and 54 on either side thereof and lower portion 14 comprises ceramic wafer 30 having adhesive and conductive metallic layers 32, 34, 36, 38 and 40 on either side thereof. A significant difference between the device 10 shown in FIG. 2 and the device 1 shown in FIG. 1 being that layer 42 depicted in FIG. 1 has been replaced with a layer of conductive epoxy 16 that holds the two portions 12 and 14 together while providing conductivity between layers 38 and 44 as was provided by layer 42 in FIG. 1. In the embodiment shown in FIG. 2, layers 38 and 44 can be electro-deposited layers or thin layers of metallic foil that undergo some degree of prestressing during the manufacturing process. Conductive epoxy layer 16 may be of any suitable material that provides the requisite adhesion between portions 12 and 14 and the requisite conductivity to allow connection to electrode layers 38 and 44, but preferably is a Ciba Geigy product identified as "AV 118" as manufactured by Ciba Specialty Chemicals Corp., East Lansing, Mich.

Figure 3:
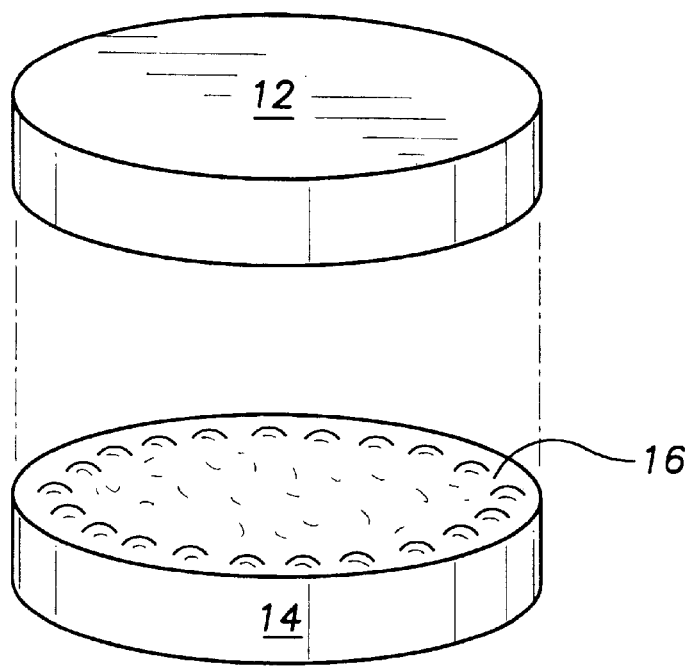
FIG. 3 is a blown apart view of a round piezoelectric transformer device of the present invention.

Portions 12 and 14 of piezoelectric transformer 10 of the present invention, are assembled as shown in FIG. 3, by applying a measured amount of uncured conductive epoxy 16 to one or both of portions 12 and 14 and then pushing portions 12 and 14 together with sufficient pressure as to cause a bead 18 of conductive epoxy 16 to seep out about the periphery 20 of the joint formed between portions 12 and 14. The amount of conductive epoxy 16 applied to portions 12 and 14 that will be adequate to provide the desired bead 18 is a matter of design choice, but sufficient material to provide an adhesive thickness of about 1 to about 3 mils and a bead of about 1 to 3 mils in thickness is adequate. The utility and importance of bead 18 to the successful practice of the present invention will be described in detail below, but suffice it to indicate at this point, that bead 18 must be of sufficient size and thickness as to provide a contact point for the piezoelectric transformer device when a subsequently installed contact device 20, as described hereinafter, is applied thereto. After curing of the conductive epoxy, a unitary structure is effectively obtained.

Figure 4:
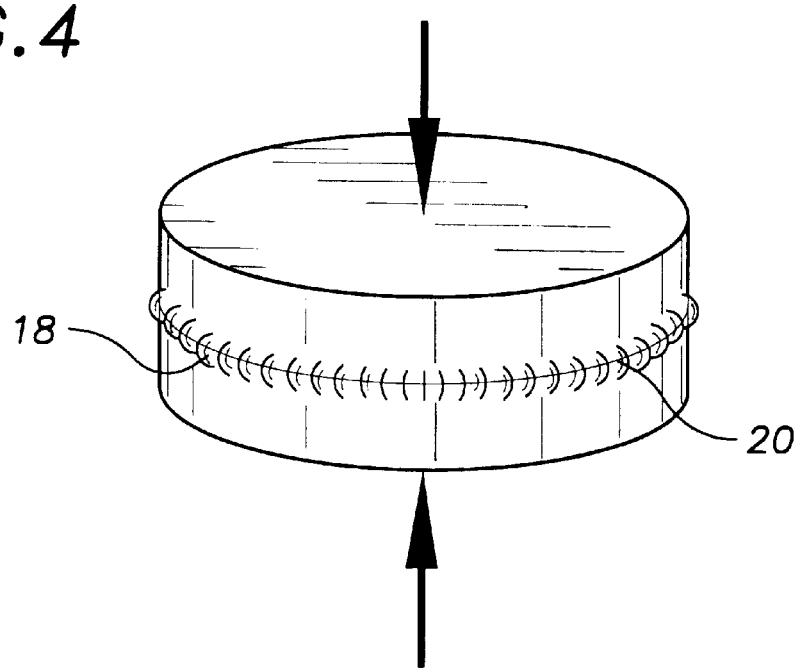
FIG. 4 is a perspective view of the piezoelectric device of FIG. 3 in its assembled configuration; and, FIG. 5 is a partially assembled side view of the piezoelectric device shown in FIGS. 3 and 4 in the mounting device of the present invention.
Figure 5:
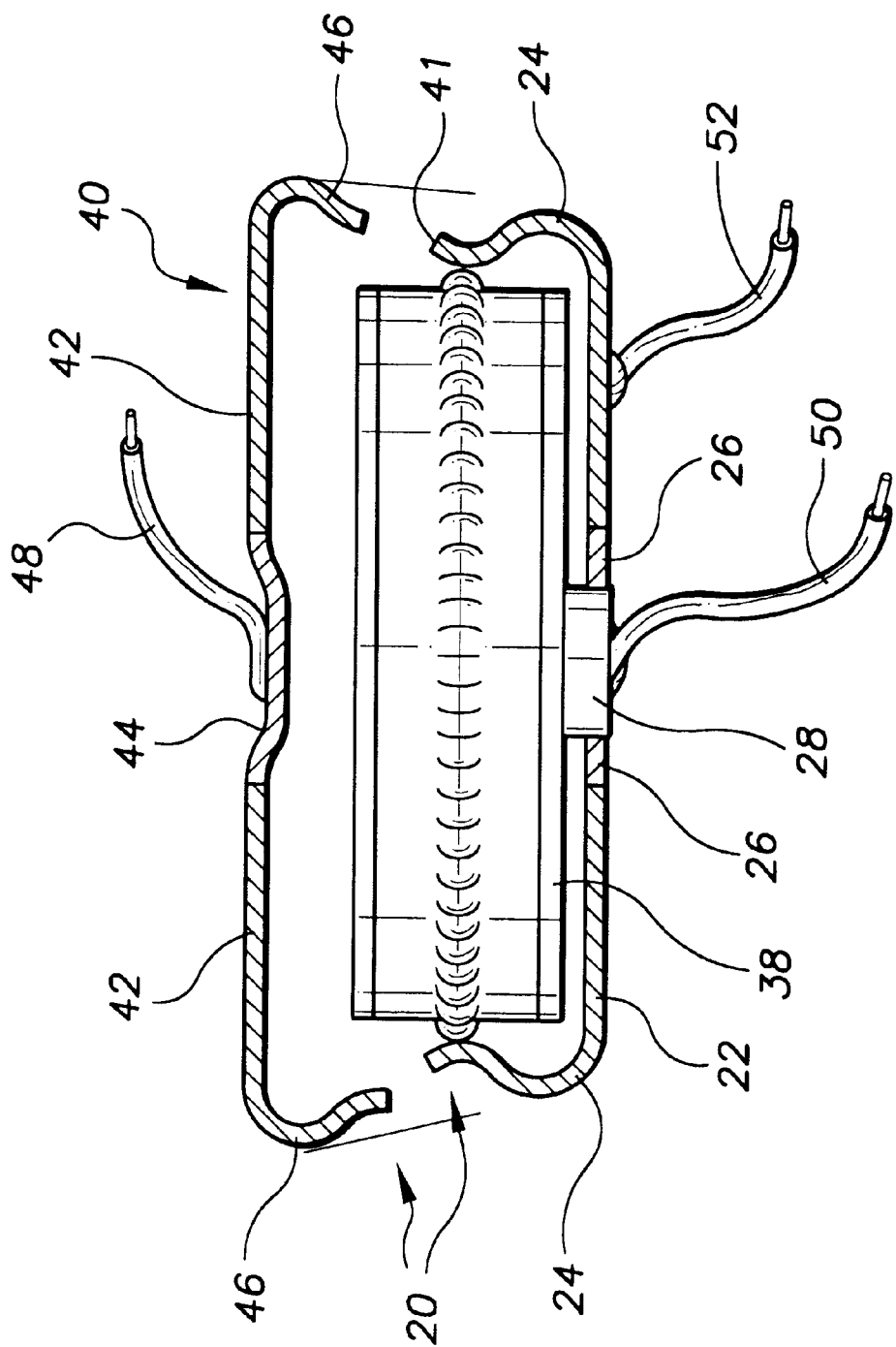

As shown in FIG. 4, the piezoelectric transformer mounting device 20 of the present invention comprises a conductive base 22 having curvaceous contact arms 24 extending at generally right angles therefrom. Contact arms 24 are designed to provide contact of conductive base 22 with bead 18 while preventing any electrical contact between conductive base 22 and layer 36 of piezoelectric transformer 10. A generally serpentine or S shape, as shown in FIG. 5, is adequate to provide this function. Contact arms 24 are equipped with flared tips 41 at their distal ends to engage a second element of piezoelectric transformer mounting device 20, cap 40, described hereinafter.

Preferably, at or near the center of conductive base 22 and insulated from conductive base 22 by insulation layer 26 is a first contact 28 whose thickness is preferably greater than conductive base 22 such that when first contact 28 is in electrical contact with layer 36 of piezoelectric transformer 10 conductive base 22 stands off of or is electrically insulated from layer 36. In the case shown in FIG. 5, gap 38 prevents electrical contact between conductive base 22 and layer 36 because of the offset provided by first contact 28. An alternative configuration for first contact 28 could be a recess or detent whose overall thickness is not greater than that of conductive base 22 but that provides the required separation between conductive base 22 and layer 36. This structure is shown in connection with cap 40 described hereinafter. Alternatively, insulating tabs (not shown) could be inserted between base 22 and layer 36 to provide the required insulation. Whatever configuration of first contact 28 and base 22 are used, they must be such that an electrical lead 38 can be attached thereto by soldering, adhesion or other appropriate method, to provide electrical contact between layer 36 and an external connection without permitting contact to occur between conductive base 22 and layer 36. At the same time, contact between conductive base 22 and bead 18 must be provided.

The second element of mounting device 20 is cap 40. Cap 40 comprises an insulating base 42 having a second contact 44 preferably at or near its center and resilient or springing arms 46 extending therefrom designed to engage flared tips 41 of contact arms 24 of conductive base 22. Any number of variations of the structure of cap 40 can be envisioned, however, it is most important that regardless of the design, cap 40 be such that the distal ends of resilient arms 46 engage flared tips 41 in such a fashion as to assure intimate electrical contact between second contact 44 and conductive layer 52 of piezoelectric transformer element 10, while simultaneously intimate electrical contact is maintained between contact arms 24 and bead 18 and first contact 22 and layer 36.

Attached to cap 40 at second contact 44, first contact 28 and at any point on the surface of conductive base 22, are appropriate electrical leads 48, 50 and 52 that provide electrical contact of piezoelectric transformer 1 with appropriate circuitry as described above. Attachment of electrical leads 48, 50 and 52 may be by any common means, such as soldering, attachment with a conductive adhesive, etc. In order to provide a piezoelectric transformer that can be easily installed into a circuit board, electrical leads 50 and 52, for example, could be in the form of pins (not shown) that extend from the surface of first contact 28 and conductive base 22 respectively, which pins simply insert into appropriately designed apertures in the circuit board.

While the piezoelectric transformer and mounting device of the present invention have been described in the context of a round piezoelectric transformer, it will be readily apparent to the skilled artisan that a similar arrangement could be achieved with any geometric configuration of the piezoelectric transformer and accompanying mounting device. For example, the use of rectangular, oval, square and other geometric configurations with the accompanying appropriate modifications of the mounting device to achieve the desired contact points and electrical lead attachment points are contemplated, and such modifications are intended to be within the scope of the appended claims.

Similarly, while the laminated multi-layer piezoelectric transformer described herein for use with the mounting device of the present invention has been preferably, one having the two portions 12 and 14 joined by a layer of conductive adhesive with a bead 16 of the conductive adhesive about the periphery of the transformer 10 at the joint, it will be readily apparent to the skilled artisan that the conductive layer at the joint could be the more conventional metallic layer having a portion thereof that extends beyond the joint and over the side of the laminated multi-layer piezoelectric transformer and about its periphery so as to be able to contact arms 24 of base 22.

Furthermore, it will be apparent to the skilled artisan, that a mounting device that utilizes only the base portion of the preferred mounting device could also be successfully applied. While this might not provide the all of the advantages of the complete mounting device, it would provide a useful means for contacting such a laminated multi-layer piezoelectric transformer. In such a case, lead 48 would be attached directly to layer 54 using conventional techniques, while leads 50 and 52 would be attached as described herein.

From the foregoing description, one skilled in the art can easily ascertain the essential characteristics of this invention, and without departing from the spirit and scope thereof, make various changes and modifications of the invention to adapt it to various usages and conditions. It is therefore intended that the scope of the invention be limited only by the scope of the appended claims.

What is claimed is:

1. A mounting device for a laminated multi-layer piezoelectric transformer comprising two piezoelectrically active elements joined by a conductive layer, at a joint; said laminated multi-layer piezoelectric transformer having a portion of said conductive layer on its surface and about its periphery at said joint, and opposing top and bottom surfaces;

said mounting device comprising:

adjacent one of said top or bottom surfaces, a conductive base having a first contact that contacts one of said top and bottom surfaces, and curvaceous arms having distal ends and extending at generally right angles from said conductive base about said laminated multi-layer piezoelectric transformer, a portion of said arms contacting said portion of said conductive layer.

2. The mounting device of claim 1 further comprising an insulating cap mounted adjacent the other of said top or bottom surfaces, said insulating cap having a second contact that contacts the other of said top and bottom surfaces, and arms extending from said insulating cap, and having distal ends designed to engage said distal ends of said curvaceous arms so as to clamp said laminated multi-layer piezoelectric transformer between said conductive base and said insulating cap.

3. The mounting device of claim 1 wherein said conductive layer comprises a layer of conductive adhesive and said portion of said conductive layer comprises a bead of said adhesive.

4. The mounting device of claim 3 further comprising an insulating cap mounted adjacent the other of said top or bottom surfaces, said insulating cap having a second contact that contacts the other of said top and bottom surfaces, and arms extending from said insulating cap, and having distal ends designed to engage said distal ends of said curvaceous arms so as to clamp said laminated multi-layer piezoelectric transformer between said conductive base and said insulating cap.

5. The mounting device of claim 2 wherein said insulating cap is fabricated from a resilient material.

6. The mounting device of claim 4 wherein said insulating cap is fabricated from a resilient material.

7. The mounting device of claim 1 further including an insulation layer between said first contact and said conductive base.

8. The mounting device of claim 7 further including electrical leads attached to said first and said second contacts and said conductive base.

9. The mounting device of claim 8 wherein said electrical leads attached to said first contact and said conductive base are in the form of pins suitable for insertion into the apertures in a circuit board.

10. A laminated multi-layer piezoelectric transformer comprising:

a first ceramic wafer having opposing major faces which are disposed on the opposite sides of a first longitudinal axis;

a second ceramic wafer having two opposing major faces which are disposed on the opposite sides of a second longitudinal axis;

wherein an electrode is bonded to each of said two opposing faces of said first ceramic wafer;

and wherein an electrode is bonded to each of said two opposing faces of said second ceramic wafer;

said first ceramic wafer being polarized in a thickness direction between said two opposing major faces of said first ceramic wafer such that said first ceramic wafer strains longitudinally when a voltage is applied across said two opposing major faces of said first ceramic wafer;

said second ceramic wafer being polarized in a thickness direction between said two opposing major faces of said second ceramic wafer such that said second ceramic wafer strains longitudinally when a voltage is applied across said two opposing faces of said second ceramic wafer, said second ceramic wafer being polarized in a direction substantially parallel to said first ceramic wafer;

wherein said first ceramic wafer having an electrode bonded to each of its two major opposing faces is mechanically bonded to said second ceramic wafer having an electrode bonded to each of its major opposing faces at a joint;

wherein said mechanical bonding is accomplished using a conductive adhesive;

a bead of said conductive adhesive about the periphery of said laminated multi-layer piezoelectric transformer at said joint.

11. The laminated multi-layer piezoelectric transformer of claim 10 wherein said conductive adhesive is a conductive epoxy.

12. In combination;

a laminated multi-layer piezoelectric transformer comprising:
  a first ceramic wafer having opposing major faces which are disposed on the opposite sides of a first longitudinal axis;
  a second ceramic wafer having two opposing major faces which are disposed on the opposite sides of a second longitudinal axis;
  wherein an electrode is bonded to each of said two opposing faces of said first ceramic wafer;
  and wherein an electrode is bonded to each of said two opposing faces of said second ceramic wafer;
  said first ceramic wafer being polarized in a thickness direction between said two opposing major faces of said first ceramic wafer such that said first ceramic wafer strains longitudinally when a voltage is applied across said two opposing major faces of said first ceramic wafer;
  said second ceramic wafer being polarized in a thickness direction between said two opposing major faces of said second ceramic wafer such that said second ceramic wafer strains longitudinally when a voltage is applied across said two opposing faces of said second ceramic wafer, said second ceramic wafer being polarized in a direction substantially parallel to said first ceramic wafer;
  wherein said first ceramic wafer having an electrode bonded to each of its two major opposing faces is mechanically bonded to said second ceramic wafer having an electrode bonded to each of its major opposing faces at a joint;
  wherein said mechanical bonding is accomplished using a conductive adhesive;
  a bead of said conductive adhesive about the periphery of said laminated multi-layer piezoelectric transformer at said joint; and
  wherein said laminated multi-layer piezoelectric transformer has top and bottom surfaces on opposing major sides thereof; and
a mounting device comprising:
  adjacent one of said top or bottom surfaces, a conductive base having a first contact which contacts one of said top and bottom surfaces, and curvaceous arms having distal ends and extending at generally right angles from said conductive base about said laminated multi-layer piezoelectric transformer, a portion of said arms contacting said bead;
  an insulating cap mounted adjacent the other of said top or bottom surfaces, said insulating cap having a second contact which contacts the other of said top and bottom surfaces, and arms extending from said insulating cap, and having distal ends designed to engage said distal ends of said curvaceous arms so as to clamp said laminated multi-layer piezoelectric transformer between said conductive base and said insulating cap.

13. The combination of claim 12 wherein said conductive adhesive is a conductive epoxy.

14. The combination of claim 12 wherein said insulating cap is fabricated from a resilient material.

15. The combination of claim 12 further including an insulation layer between said first contact and said conductive base.

16. The combination of claim 15 further including electrical leads attached to said first and said second contacts and said conductive base.

17. The combination of claim 16 wherein said electrical leads attached to said first contact and said conductive base are in the form of pins suitable for insertion into the apertures of a circuit board.

* * * * *